(12) United States Patent
Li

(10) Patent No.: US 11,908,862 B2
(45) Date of Patent: Feb. 20, 2024

(54) FINFET AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 526 days.

(21) Appl. No.: 16/707,042

(22) Filed: Dec. 9, 2019

(65) Prior Publication Data

US 2020/0111789 A1 Apr. 9, 2020

Related U.S. Application Data

(62) Division of application No. 15/473,682, filed on Mar. 30, 2017, now Pat. No. 10,541,238.

(30) Foreign Application Priority Data

May 5, 2016 (CN) .......................... 201610292137.8

(51) Int. Cl.
*H01L 27/092* (2006.01)
*H01L 29/78* (2006.01)
(Continued)

(52) U.S. Cl.
CPC ...... *H01L 27/0924* (2013.01); *H01L 21/3081* (2013.01); *H01L 21/30604* (2013.01);
(Continued)

(58) Field of Classification Search
CPC .......... H01L 21/30604; H01L 21/3065; H01L 21/3081; H01L 21/3083; H01L 21/31111;
(Continued)

(56) References Cited

U.S. PATENT DOCUMENTS 9,166,024 B2 10/2015 Hung et al.
2009/0095980 A1 4/2009 Yu et al.
(Continued)

FOREIGN PATENT DOCUMENTS

CN 101414632 A 4/2009

OTHER PUBLICATIONS

The European Patent Office (EPO) The Extended European Search Report for 17168684.3 dated Oct. 5, 2017 7 Pages.

*Primary Examiner* — Meiya Li
(74) *Attorney, Agent, or Firm* — Anova Law Group, PLLC

(57) ABSTRACT

A FinFET is provided. The FinFET includes a substrate including an NMOS (N-type metal-oxide-semiconductor) region; a plurality of fins formed on the substrate; an isolation layer formed between adjacent fins of the plurality of fins and on the substrate; a gate structure across a length portion of the fin and covering a portion of each of a top surface and sidewalls of the fin; and an in-situ doped epitaxial layer formed on each of the etched fin on both sides of the gate structure. The doping ions in the in-situ doped epitaxial layer are N-type ions.

9 Claims, 7 Drawing Sheets

(51) Int. Cl.
    *H01L 29/66*     (2006.01)
    *H01L 21/8238*   (2006.01)
    *H01L 21/306*    (2006.01)
    *H01L 21/308*    (2006.01)
    *H01L 29/08*     (2006.01)
    H01L 21/3065    (2006.01)
    H01L 21/311     (2006.01)

(52) U.S. Cl.
    CPC ............ *H01L 21/823807* (2013.01); *H01L 21/823814* (2013.01); *H01L 21/823821* (2013.01); *H01L 21/823878* (2013.01); *H01L 29/0847* (2013.01); *H01L 29/66795* (2013.01); *H01L 29/785* (2013.01); *H01L 29/7848* (2013.01); *H01L 21/3065* (2013.01); *H01L 21/3083* (2013.01); *H01L 21/31111* (2013.01); *H01L 29/66545* (2013.01)

(58) Field of Classification Search
    CPC ..... H01L 21/823807; H01L 21/823814; H01L 21/823821; H01L 21/823878; H01L 27/0924; H01L 29/0847; H01L 29/66545; H01L 29/66795; H01L 29/7848; H01L 29/785
    See application file for complete search history.

(56) References Cited

U.S. PATENT DOCUMENTS

| | | | |
|---|---|---|---|
| 2012/0068268 A1 | 3/2012 | Hsiao et al. | |
| 2014/0273429 A1* | 9/2014 | Wei | H01L 21/845 |
| | | | 438/595 |
| 2015/0091059 A1 | 4/2015 | Hung et al. | |
| 2015/0214366 A1 | 7/2015 | Chang et al. | |
| 2015/0303118 A1 | 10/2015 | Wang et al. | |
| 2016/0211372 A1 | 7/2016 | Yu et al. | |
| 2017/0133386 A1* | 5/2017 | Lee | H01L 21/823878 |

* cited by examiner

FINFET AND FABRICATION METHOD THEREOF

CROSS-REFERENCES TO RELATED APPLICATIONS

This application is a divisional application of U.S. patent aplication Ser. No. 15/473,682, filed on Mar. 30, 2017, which claims the priority of Chinese patent application No. 201610292137.8, filed on May 5, 2016, the entirety of which is incorporated herein by reference.

FIELD OF THE DISCLOSURE

The present disclosure generally relates to the field of semiconductor manufacturing technology and, more particularly, relates to a fin field effect transistor (FinFET) and fabrication method thereof.

BACKGROUND

With the continuous development of semiconductor technology, the development trend of semiconductor process node following Moore's law continues to decrease. To adapt to the reduction of the process node, channel length of metal-oxide-semiconductor field-effect transistor (MOSFET) has to be shortened. The reduction of the channel length has advantages of increasing the core density of the chip and the switching speed of the MOSFET, etc.

However, the distance between a source region and a drain region of a device is shortened accordingly as the channel length of the device reduces. Therefore, control ability of a gate to the channel is degraded, and it is more and more difficult to pinch off the channel by the gate voltage. As a result, a subthreshold leakage phenomenon, also known as a short-channel effect (SCE), is more likely to occur.

Therefore, to better meet the requirements of scaling down the device size, the semiconductor process gradually began to transition from a planar MOSFET to a three-dimensional transistor having higher efficiency, such as a fin field effect transistor (FinFET). In the FinFET, the gate can control the ultrathin body (fin portion) from at least two sides. Thus, the FinFET has a much stronger gate-to-channel control ability than the planar MOSFET device, and can well suppress the short-channel effect. Compared to other devices, the FinFET has better compatibility with existing integrated circuit fabrication techniques.

However, the performance of the FinFET formed by the existing techniques needs to be improved. The disclosed device structures and methods are directed to solve one or more problems set forth above and other problems.

BRIEF SUMMARY OF THE DISCLOSURE

One aspect of the present disclosure includes a method for fabricating a FinFET. The method includes providing a substrate including an NMOS region, and forming a plurality of fins on the substrate. The method also includes forming an isolation layer between adjacent fins and on the substrate, and forming a gate structure across a length portion of the fin and covering a portion of each of a top surface and sidewalls of the fin. In addition, the method includes forming a first mask layer on the top surface and sidewalls of the fin in the NMOS region, and etching the first mask layer to expose the top surface of the fin on both sides of the gate structure along the length direction of the fin in the NMOS region. Moreover, the method includes removing a thickness portion of the fin on both sides of the gate structure along the length direction of the fin, wherein the etched fin in the NMOS region and the remaining first mask layer form a first trench. Further, the method includes performing a thinning treatment of the remaining first mask layer on a sidewall of the first trench in the NMOS region to increase width of the first trench, and forming an in-situ doped epitaxial layer to fill up the first trench, wherein doping ions in the in-situ doped epitaxial layer are N-type ions.

Another aspect of the present disclosure includes a Fin-FET. The FinFET includes a substrate including an NMOS region, and a plurality of fins formed on the substrate. The FinFET also includes an isolation layer formed between adjacent fins and on the substrate, and a gate structure across a length portion of the fin and covering a portion of each of a top surface and sidewalls of the fin. Further, the FinFET includes an in-situ doped epitaxial layer formed on each of the etched fin on both sides of the gate structure, wherein doping ions in the in-situ doped epitaxial layer are N-type ions.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

The operating speed of a MOSFET formed by the existing techniques is slow. This may be because of a too-large contact resistance between a surface of an N-type source-drain doped region formed inside a fin portion and a metallic silicide formed thereon.

Figure 11:
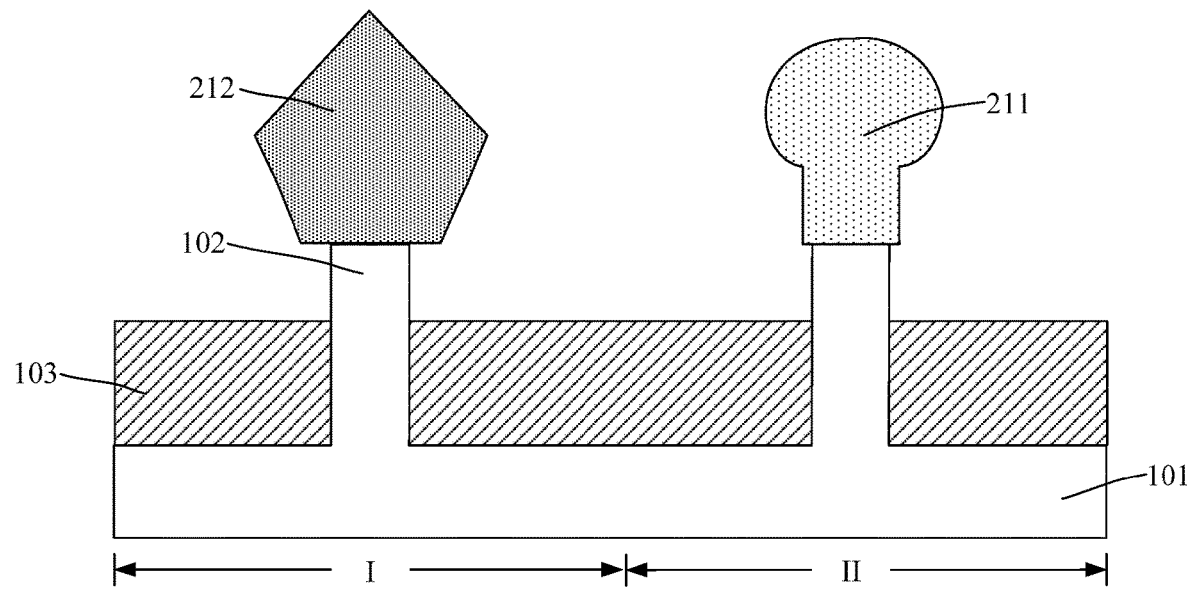
Figure 12:
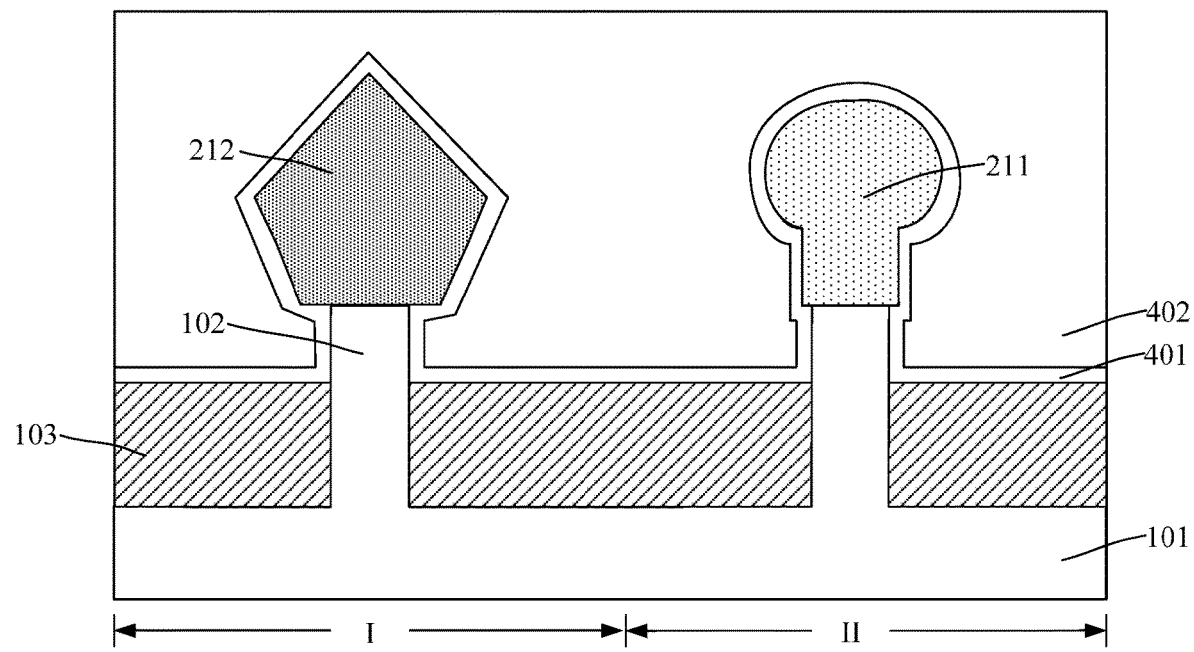
Figure 13:
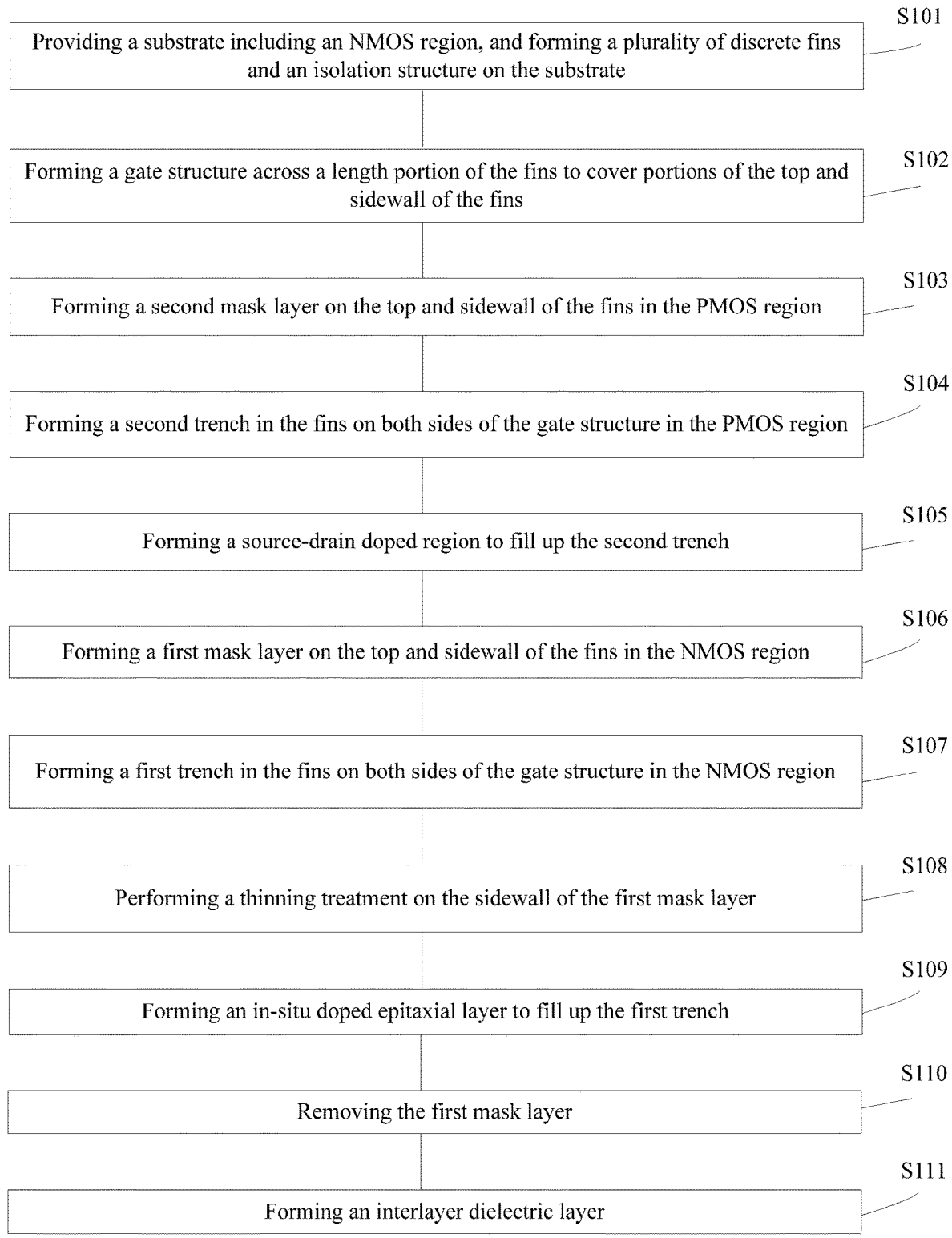
FIG. 13 illustrates an exemplary fabrication method to form a FinFET consistent with various disclosed embodiments of the present disclosure.

The present disclosure provides a FinFET and fabrication method thereof. FIG. 13 illustrates an exemplary fabrication method to form a FinFET consistent with the disclosed embodiments; and FIGS. 1-12 illustrate semiconductor structures corresponding to certain stages of the exemplary fabrication method.

Figure 1:
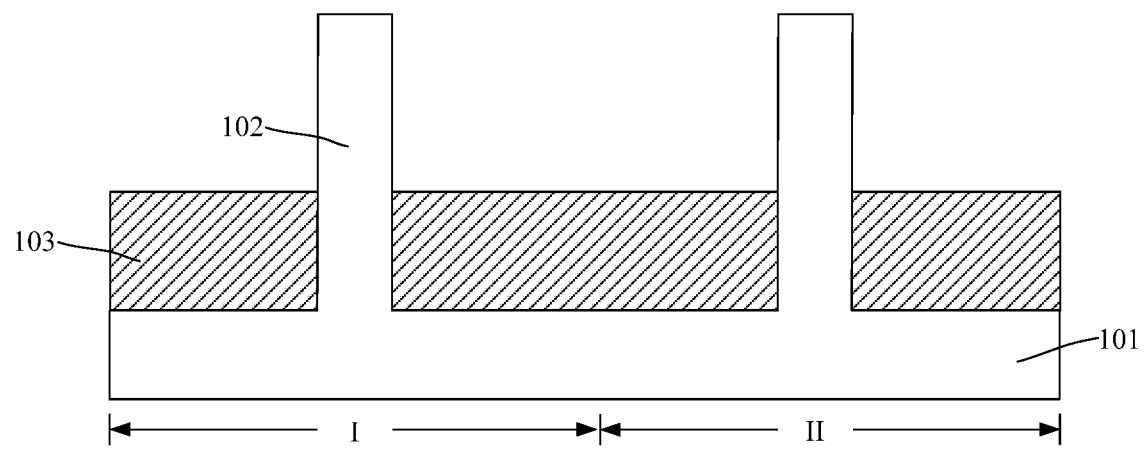
FIGS. 1-12 illustrate semiconductor structures corresponding to certain stages of an exemplary fabrication process to form a FinFET consistent with various disclosed embodiments of the present disclosure.

As shown in FIG. 13, at the beginning of the fabrication method, a substrate with certain structures may be formed (S101). FIG. 1 illustrates a corresponding semiconductor structure.

Referring to FIG. 1, a substrate 101 including an NMOS region II may be formed. A fin part including a plurality of discrete fins 102 may be formed on the substrate 101. An isolation layer 103 may be formed on the substrate 101 to cover portions of the sidewalls of the fins 102. The top of the isolation layer 103 may be lower than the top of the fins 102.

In one embodiment, a FinFET configured to form a CMOS device is described herein as an example. The substrate 101 may also include a PMOS region I. The discrete fins 102 may be formed on the substrate 101 in both the PMOS region I and the NMOS region II. In certain embodiments, when the formed FinFET only includes an NMOS device, the substrate may only include the NMOS region.

The substrate 101 may be made of silicon (Si), germanium (Ge), germanium-silicon alloy (GeSi), silicon carbide (SiC), gallium arsenide (GaAs), or indium gallium (InGa), etc. The substrate 101 may also be a silicon substrate formed on insulator (SOI), or a germanium substrate formed on insulator (GOI), etc. The fins 102 may be made of silicon (Si), germanium (Ge), germanium-silicon alloy (GeSi), silicon carbide (SiC), gallium arsenide (GaAs), or indium gallium (InGa), etc. In one embodiment, the substrate 101 may be a silicon substrate, and the fins 102 may be made of silicon.

In one embodiment, forming the substrate 101 and the fins 102 may include: providing an initial substrate; forming a patterned hard mask layer on the initial substrate; and using the hard mask layer as a mask to etch the initial substrate. The etched initial substrate may be configured as the substrate 101, and the protrusion formed on the substrate 101 may be configured as the fins 102.

The isolation layer 103 may cover portions of the sidewalls of the fins 102, and the top of the isolation layer 103 may be lower than the top of the fins 102. The isolation layer 103 may be configured to electrically isolate the adjacent fins 102. The isolation layer 103 may be made of an insulating material, such as silicon oxide, silicon nitride, silicon oxynitride, or silicon carbonitride oxide, etc. In one embodiment, the isolation layer 103 may be made of silicon oxide.

Figure 2:
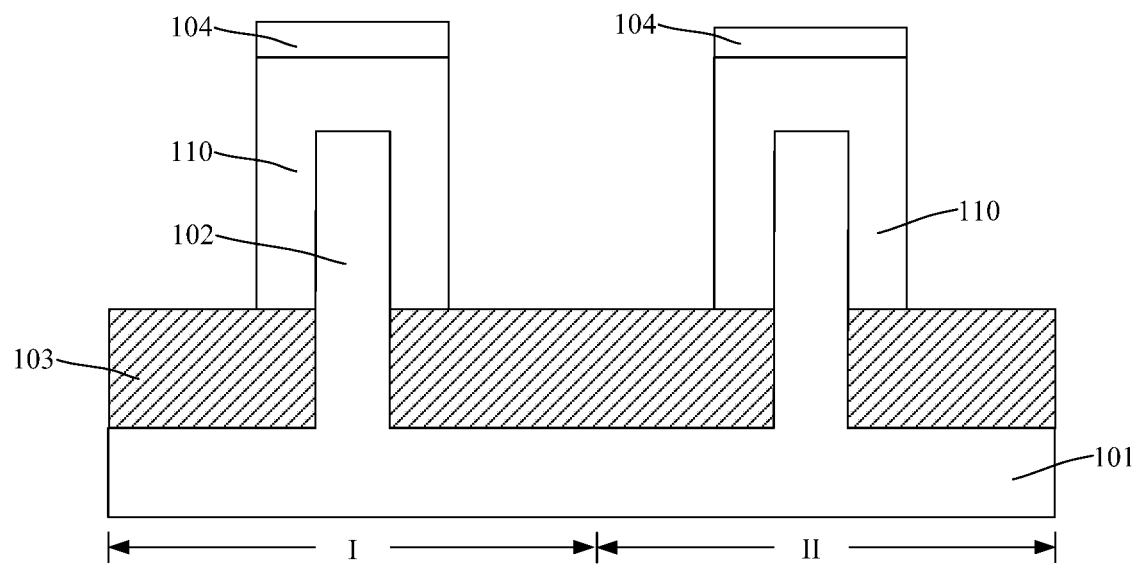

Returning to FIG. 13, after forming the substrate and the fins, a gate structure may be formed (S102). FIG. 2 illustrates a corresponding semiconductor structure.

Referring to FIG. 2, a gate structure 110 may be formed on the isolation layer 103. The gate structure 110 may be formed across a length portion of a fin 102 to cover portions of the top and sidewall of the fin 102.

In one embodiment, the gate structure 110 may be formed on the isolation layer 103 in both the NMOS region II and the PMOS region I. For example, the gate structure 110 in the PMOS region I may be formed on the isolation layer 103 in the PMOS region I, across the fin 102 in the PMOS region I to cover portions of the top and sidewall of the fin 102 in the PMOS region I. The gate structure 110 in the NMOS region II may be formed on the isolation layer 103 in the NMOS region II, across the fin 102 in the NMOS region II to cover portions of the top and sidewall of the fin 102 in the NMOS region II.

In one embodiment, the gate structure 110 may be a dummy gate structure. The dummy gate structure 110 may be subsequently replaced with a metal gate structure of a semiconductor device by removing the dummy gate structure 110 to form an opening and then forming the metal gate structure in the opening. The gate structure 110 may be a single layer structure, or a stacked structure. The gate structure 110 may include a dummy gate layer. For example, the gate structure 110 may include a dummy oxide layer and a dummy gate layer formed on the dummy oxide layer. The dummy gate layer may be made of polysilicon, or amorphous carbon, etc. The dummy oxide layer may be made of silicon oxide, or silicon oxynitride, etc.

In another embodiment, the gate structure 110 may be the metal gate structure of the semiconductor device. The gate structure 110 may include a gate dielectric layer and a gate electrode layer formed on the gate dielectric layer. The gate dielectric layer may be made of silicon oxide, or high-K gate dielectric material, etc. The gate electrode layer may be made of polysilicon, or a metal material. The metal material may include one or more of Ti, Ta, TiN, TaN, TiAl, TiAlN, Cu, Al, W, Ag and Au.

In one embodiment, the gate structure 110 configured as the dummy gate structure is described herein as an example. Forming the gate structure 110 may include: forming a dummy gate film on the isolation layer 103, where the dummy gate film may cross a length portion of the fins 102 and cover the top and sidewalls of the fins 102; forming a hard mask layer 104 on the dummy gate film, where the hard mask layer 104 may define the pattern of the gate structure 110 to be formed; and using the hard mask layer 104 as a mask to pattern the dummy gate film to form the gate structure 110 on the isolation layer 103 in both the PMOS region I and the NMOS region II.

In one embodiment, the hard mask layer 104 formed on the top surface of the gate structure 110 may be retained. The hard mask layer 104 may protect the top of the corresponding gate structure 110 during the subsequent fabrication processes. The hard mask layer 104 may be made of silicon nitride, silicon oxynitride, silicon carbide, or boron nitride, etc.

After forming the gate structure 110, the fabrication process may also include: forming an offset spacer on the side surface of the gate structure 110; using the offset spacer in the PMOS region I as a mask to form a P-type source-drain lightly doped region in the fins 102 on both sides of the gate structure 110 in the PMOS region I; and using the offset spacer in the NMOS region II as a mask to form an N-type source-drain lightly doped region in the fins 102 on both sides of the gate structure 110 in the NMOS region II.

Figure 3:
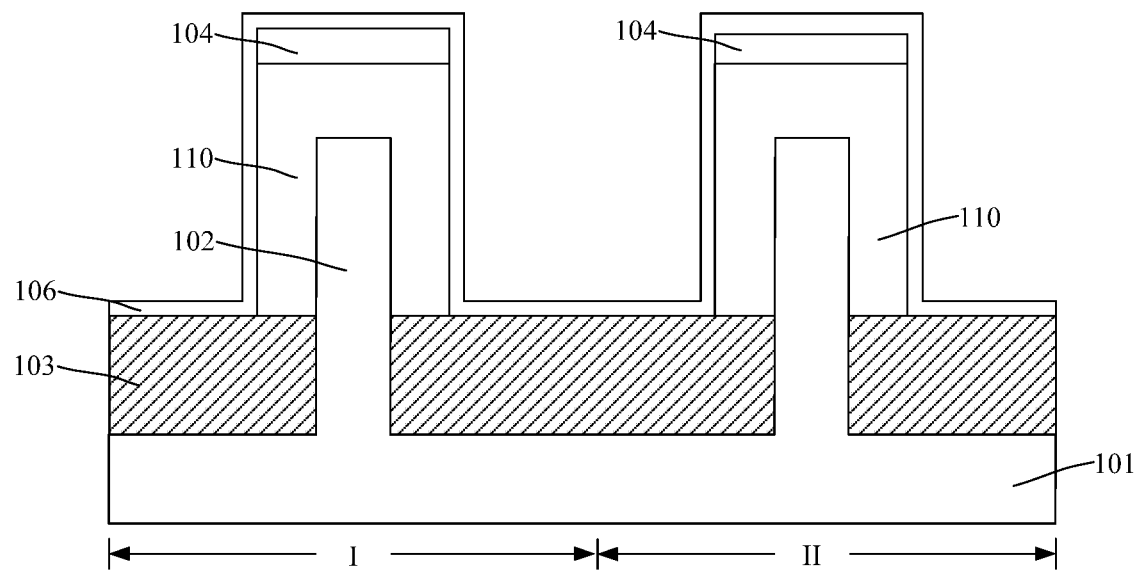
Figure 4:
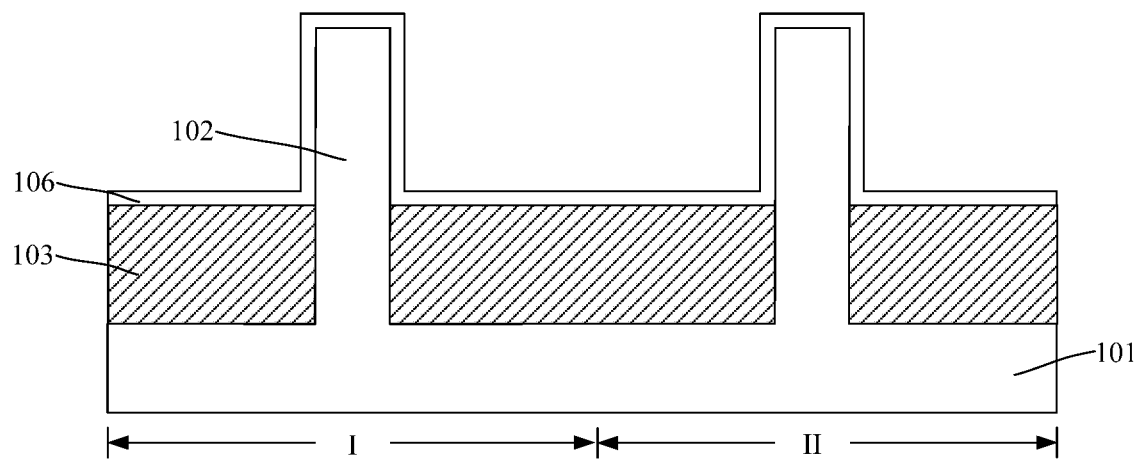

Returning to FIG. 13, after forming the gate structure, a second mask layer may be formed (S103). FIGS. 3-4 illustrate a corresponding semiconductor structure. FIG. 3 is a schematic diagram formed on the basis of FIG. 2. FIG. 3 and FIG. 4 are cross-sectional views of a same three-dimensional structure along different cutting lines.

Referring to FIG. 4, a second mask layer 106 may be formed over the top and sidewall of the fin 102 in the PMOS region I. The second mask layer 106 may also be formed over the top and sidewall of the fin 102 in the NMOS region II.

Referring to FIG. 3, the second mask layer 106 may also be formed over the top and sidewall of the gate structure 110 in both the PMOS region I and the NMOS region II, and the isolation layer 103. The second mask layer 106 may be formed by a chemical vapor deposition process, a physical vapor deposition process, or an atomic layer deposition process, etc. In one embodiment, an atomic layer deposition process may be performed to form the second mask layer 106.

The second mask layer 106 formed on the sidewall of the fin 102 in the PMOS region I may be used as a mask when subsequently etching portions of thickness of the fin 102 in the PMOS region I. Therefore, there is a certain distance between the subsequently formed second trench and the previously formed P-type source-drain lightly doped region, such that the P-type source-drain lightly doped region may not be completely etched and removed. The second mask layer 106 formed on the sidewall of the fin 102 in the PMOS region I may also protect the sidewall of the fin 102, and avoid the subsequent epitaxial growth process occurring on the sidewall of the fin 102 in the PMOS region I. Further, the second mask layer 106 in the NMOS region II may also be configured as portion of a subsequently formed first mask layer.

The second mask layer 106 may be made of silicon nitride, silicon oxide, boron nitride, or silicon oxynitride, etc. The second mask layer 106 may be made of a material different from the fins 102 and the isolation layer 103. In one embodiment, the second mask layer 106 may be made of silicon nitride, and the thickness of the second mask layer 106 may be in a range of approximately 3 nm-6 nm.

Figure 5:
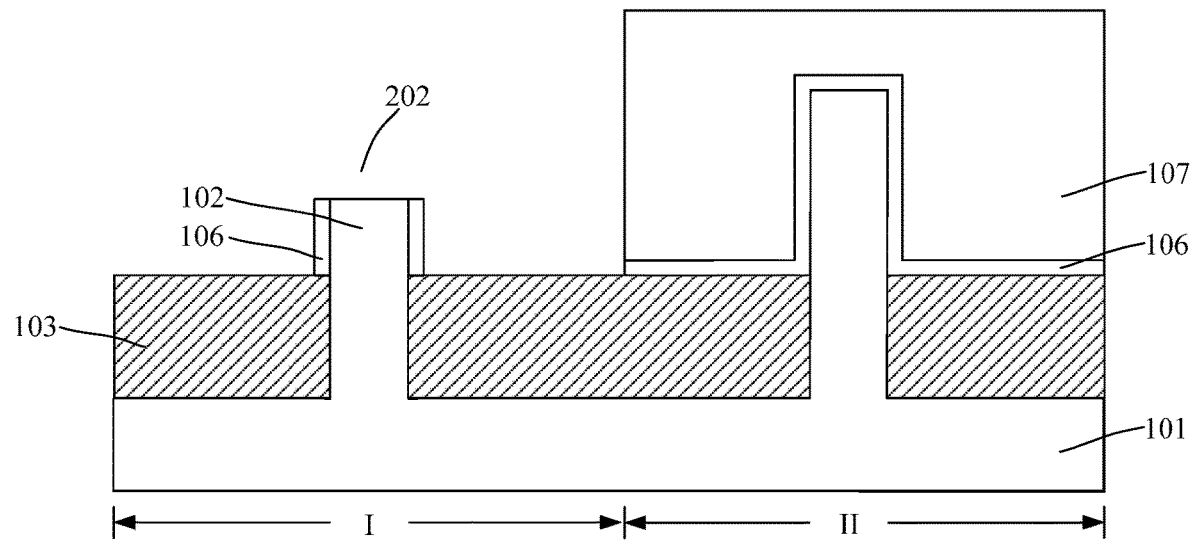

Returning to FIG. 13, after forming the second mask layer, a second trench may be formed (S104). FIG. 5 illustrates a corresponding semiconductor structure. The cross-sectional schematics provided in the subsequent fabrication process are formed on the basis of FIG. 4 unless otherwise specified.

Referring to FIG. 5, the second mask layer 106 formed on the top of the fins 102 on both sides of the gate structure 110 (shown in FIG. 3) along a length direction of the fin in the PMOS region I may be etched and removed to expose the top surface of the fins 102 on both sides of the gate structure 110 along the length direction of the fin in the PMOS region I. Portions of thickness of the fins 102 in the PMOS region I may also be etched and removed to form a second trench 202. The second trench 202 may be formed in the etched fins 102, for example, between adjacent gate structures, in the PMOS region I.

A first patterned layer 107 may be formed on the NMOS region II before etching the second mask layer 106 formed on the top of the fins 102 on both sides of the gate structure 110 in the PMOS region I. The first patterned layer 107 may cover the second mask layer 106 in the NMOS region II, and may be configured to protect the second mask layer 106 in the NMOS region II. The first patterned layer 107 may also cover regions not expected to be etched in the PMOS region I.

In one embodiment, the first patterned layer 107 may be made of a photoresist material. After forming the second trench 202, the first patterned layer 107 may be removed. The first patterned layer 107 may be removed by a wet process, or an ashing process, etc.

A dry etching process may be performed to remove the second mask layer 106 formed on the top of the fins 102 on both sides of the gate structure 110 in the PMOS region I, as shown in FIG. 5. When etching and removing the second mask layer 106 formed on the top of the fins 102 on both sides of the gate structure 110 in the PMOS region I, the second mask layer 106 formed on the top of the gate structure 110 in the PMOS region I and on portions of the isolation layer 103 may also be etched and removed. After exposing the top surface of the fins 102 on both sides of the gate structure 110 in the PMOS region I, portions of the thickness of the fins 102 may continue to be etched to form the second trench 202.

In one embodiment, an anisotropic etching process may be performed to remove portions of thickness of the fins 102. The anisotropic etching process may be a reactive ion etching process. The process parameters of the reactive ion etching process may include the following. The reactive gases may include $CF_4$, $SF_6$ and Ar, the flow rate of $CF_4$ may be in a range of approximately 50 sccm-100 sccm, the flow rate of $SF_6$ may be in a range of approximately 10 sccm-100 sccm, and the flow rate of Ar may be in a range of approximately 100 sccm-300 sccm. The source power may be in a range of approximately 50 W-1000 W, and the bias power may be in a range of approximately 50 W-250 W. The chamber pressure may be in a range of approximately 50 mTorr-200 mTorr, and the chamber temperature may be in a range of approximately 20° C.-90 ° C.

In one embodiment, to increase volume of a P-type source-drain doped region subsequently formed in the second trench 202, the second mask layer 106 formed on the sidewall of the fins 102 in the PMOS region I may also be etched while etching the fins 102 in the PMOS region I. After forming the second trench 202, the top of the second mask layer 106 formed on the sidewall of the fins 102 in the PMOS region I may be coplanar with the top of the fins 102.

Figure 6:
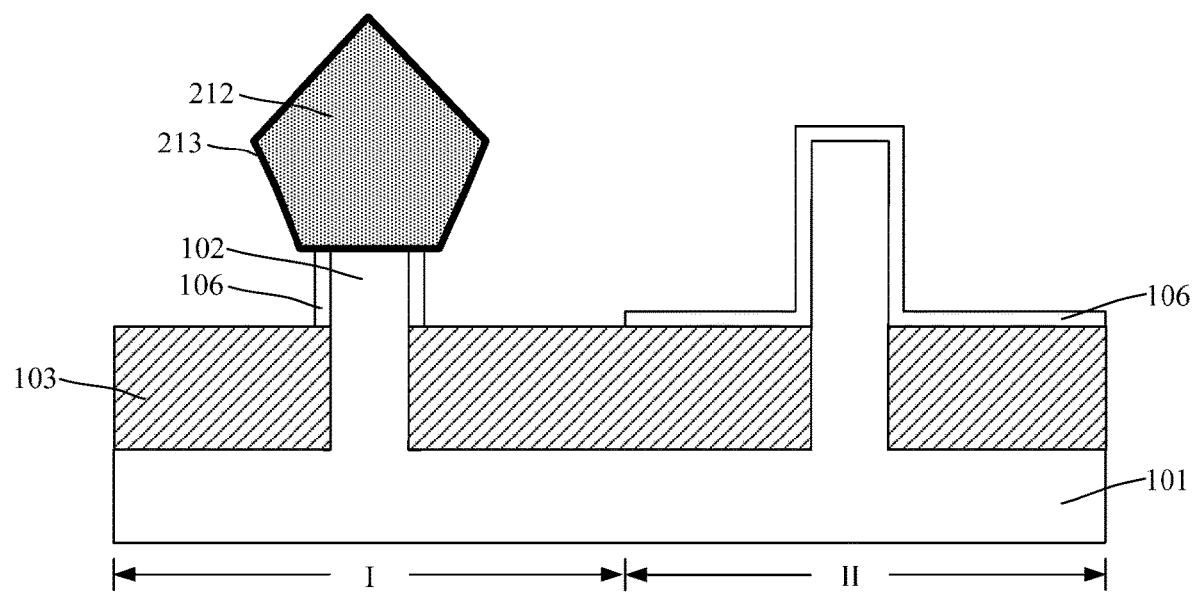

Returning to FIG. 13, after forming the second trench, a P-type source-drain doped region may be formed (S105). FIG. 6 illustrates a corresponding semiconductor structure.

Referring to FIG. 6, a P-type source-drain doped region 212 may be formed to fill up the second trench 202 (shown in FIG. 5). The P-type source-drain doped region 212 may be formed by a selective epitaxial process. The P-type source-drain doped region 212 may be made of P-type doped Si, or SiGe, etc. In one embodiment, a stress layer may be formed in the P-type source-drain doped region 212. The stress layer may provide a compressive stress on the channel region in the PMOS region I, thus improving the carrier mobility of the PMOS region I. The top of the P-type source-drain doped region 212 may be above the top of the second trench 202.

In one embodiment, the stress layer may be formed by a selective epitaxial process. The P-type source-drain doped region may be formed by in-situ self-doping P-type ions when forming the stress layer. In certain embodiments, after forming the stress layer, the P-type source-drain doped region may be formed by performing a P-type ion doping process on the stress layer.

In one embodiment, the top of the P-type source-drain doped region 212 may be above the top of the fins 102 (shown in FIG. 4) before forming the second trench 202. Because of the characteristic of the selective epitaxial process, the side surface of the P-type source-drain doped region 212 above the fins 102 (shown in FIG. 4) may include a vertex that protrudes away from the fins 102. In certain embodiments, the top of the P-type source-drain doped region 212 may be coplanar with the top of the fins 102 (shown in FIG. 4) before forming the second trench 202.

To avoid process damages to the surface of the P-type source-drain doped region 212 by the subsequent fabrication processes, after forming the P-type source-drain doped region 212 and before subsequently forming a third mask layer, an oxidation treatment may be performed on the surface of the P-type source-drain doped region 212 to form an oxidation protection layer 213 on the surface of the P-type source-drain doped region 212. The oxidation treatment may include dry oxidation, wet oxidation, or water vapor oxidation, etc.

Figure 7:
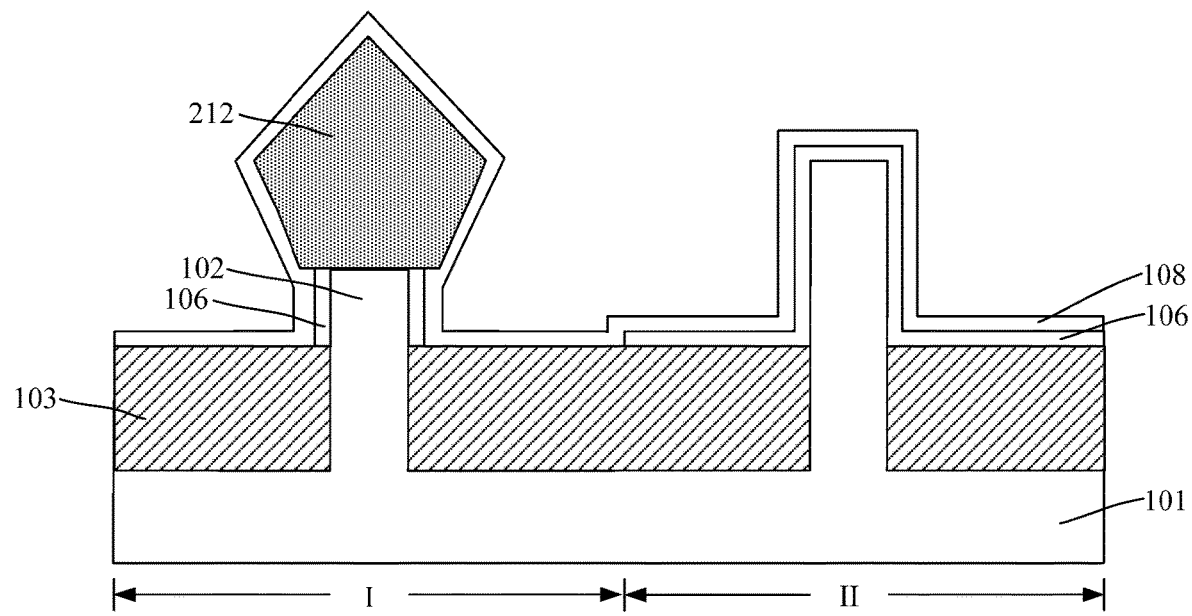

Returning to FIG. 13, after forming the P-type source-drain doped region, a first mask layer may be formed (S106). FIG. 7 illustrates a corresponding semiconductor structure.

Referring to FIG. 7, after forming the P-type source-drain doped region 212, a first mask layer may be formed on the top and sidewall of the fins 102 in the NMOS region II. For example, forming the first mask layer may include forming a third mask layer 108 on the second mask layer 106 in the NMOS region II after forming the P-type source-drain doped region 212. The second mask layer 106 and the third mask layer 108 in the NMOS region II may be configured as the first mask layer.

In one embodiment, the third mask layer 108 may also be formed on the P-type source-drain doped region 212, the isolation layer 103 in the PMOS region I, and the top of the gate structure 110 in the PMOS region I.

The material and fabrication process of the third mask layer 108 may be referred to that of the second mask layer 106. In one embodiment, the third mask layer 108 may be made of silicon nitride. An atomic layer deposition process may be performed to form the third mask layer 108.

If the thickness of the first mask layer is too small, the mechanical strength of the first mask layer formed on the sidewall of the fins 102 in the NMOS region II may be weak. The adhesion between the first mask layer and the fins 102 in the NMOS region II may be poor, thus the first mask layer formed on the sidewall of the fins 102 in the NMOS region II may be prone to fall off when subsequently forming a first trench by performing an etching process. If the thickness of the first mask layer is too thick, the filling effect of the first mask layer at the corner where the isolation layer 103 and the fin portion 102 meet may be degraded.

In one embodiment, before performing a thinning treatment, the thickness of the first mask layer may be in a range of approximately 6 nm-12 nm. Therefore, the first mask layer cannot fall off when forming the first trench, and the filling effect of the first mask layer at the corner where the isolation layer 103 and the fin portion 102 meet may be desired.

The thickness of the third mask layer 108 may be determined based on the thickness of the second mask layer 106 formed on the fins 102 in the NMOS region II and the thickness requirement of the first mask layer. In one embodiment, the thickness of the third mask layer may be in a range of approximately 3 nm-6 nm.

Figure 8:
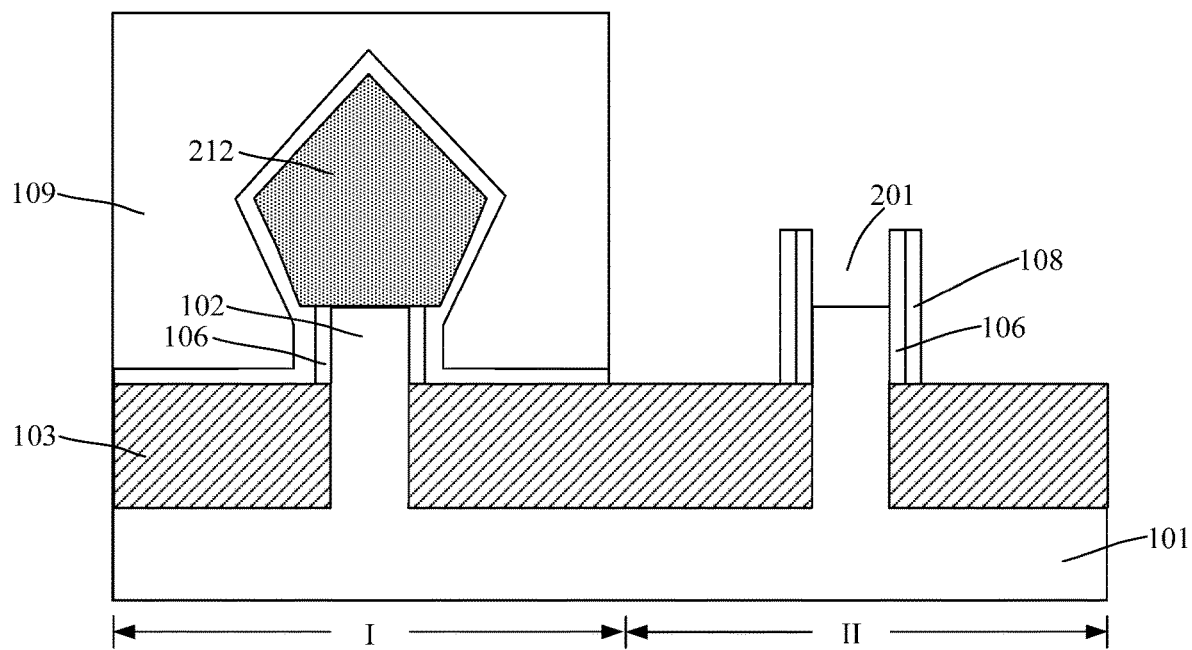

Returning to FIG. 13, after forming the first mask layer, a first trench may be formed (S107). FIG. 8 illustrates a corresponding semiconductor structure.

Referring to FIG. 8, the first mask layer formed on the top of the fins 102 on both sides of the gate structure 110 (shown in FIG. 3) in the NMOS region II may be etched and removed to expose the top surface of the fins 102 on both sides of the gate structure 110 in the NMOS region II. Portions of thickness of the fins 102 in the NMOS region II may also be etched and removed. The etched fins 102 in the NMOS region II and the first mask layer may form the first trench 201, as shown in FIG. 8.

A second patterned layer 109 may be formed on the PMOS region I before forming the first trench 201. The second patterned layer 109 may cover the P-type source-drain doped region 212 and the gate structure 110 in the PMOS region I. The second patterned layer 109 may also be formed on the third mask layer 108 in the PMOS region I, and be configured to protect the PMOS region I. The second patterned layer 109 may also cover regions not expected to be etched in the NMOS region II.

In one embodiment, the second patterned layer 109 may be made of a photoresist material. Before etching and removing the first mask layer formed on the top of the fins 102 on both sides of the gate structure 110 in the NMOS region II, the first mask layer may also be formed on the isolation layer 103 and the gate structure 110 in the NMOS region II. When etching and removing the first mask layer formed on the top of the fins 102 on both sides of the gate structure 110 in the NMOS region II, the first mask layer formed on the top of the gate structure 110 in the NMOS region II and on portions of the isolation layer 103 may also be removed. After exposing the top surface of the fins 102 on both sides of the gate structure 110 in the NMOS region II, portions of the thickness of the fins 102 in the NMOS region II may continue to be etched to form the first trench 201.

The process of etching and removing portions of the thickness of the fins 102 in the NMOS region II can be referred to the corresponding description of the above-described process of forming the second trench 202 and is not repeated herein. After forming the first trench 201, the second patterned layer 109 may be removed by a wet process, or an ashing process, etc.

Figure 9:
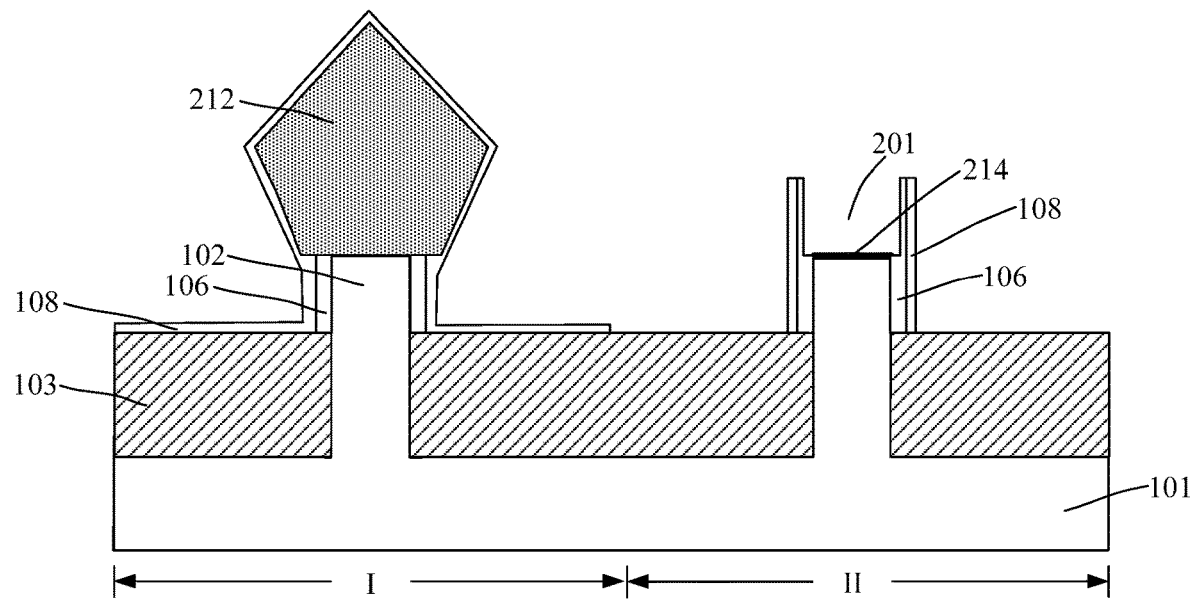

Returning to FIG. 13, after forming the first trench, a thinning treatment may be performed (S108). FIG. 9 illustrates a corresponding semiconductor structure.

Referring to FIG. 9, after forming the first trench 201, a thinning treatment may be performed on the sidewall of the first mask layer formed on the fins 102 in the NMOS region II. The thinning treatment may be configured to increase width of the first trench 201.

When performing the thinning treatment on the sidewall of the first mask layer formed on the fins 102 in the NMOS region II, the thickness of the third mask layer 108 in the PMOS region I exposed to the thinning treatment process environment may also be thinned. The height of the first mask layer formed on the fins 102 in the NMOS region II may also be reduced correspondingly.

In one embodiment, to avoid damages to the top of the fins 102 at the bottom of the first trench 201 by the thinning treatment, before performing the thinning treatment, an oxidation treatment may be performed on the surface of the fin portion 102 exposed by the first trench 201 to form an oxidation protection layer 214 on the surface of the fins 102 exposed by the first trench 201. The oxidation treatment may include dry oxidation, wet oxidation, or water vapor oxidation, etc.

The thinning treatment may be configured to increase the width of the first trench 201. Therefore, after performing the thinning treatment, the volume capacity of the first trench 201 may increase. Correspondingly, the volume of an in-situ doped epitaxial layer subsequently formed in the first trench 201 may increase. The in-situ doped epitaxial layer may be configured to form an N-type source-drain doped region. Therefore, the resistance of the N-type source-drain doped region may decrease, and the surface area of the N-type source-drain doped region may increase. As a result, the contact resistance between the surface of the N-type source-drain doped region and the metal silicide may decrease, thus improving the performance of the device in the NMOS region II.

A wet etching process may be performed in the thinning treatment. In one embodiment, the etching rate of the thinning treatment may be in a range of approximately 0.5 Å/sec-2 Å/sec. In one embodiment, the first mask layer may be made of silicon nitride. The etching liquid used in the thinning treatment may be a phosphoric acid solution having a phosphoric acid concentration in a range of approximately 75%-85%. The solution temperature may be in a range of approximately 80° C.-200° C. To reduce the etching rate of the thinning treatment, suspended particles may be added to the phosphoric acid solution. For example, nano-silica particles may be added.

The in-situ doped epitaxial layer may be subsequently formed in the first trench 201. To prevent the first mask layer formed on the fins 102 in the NMOS region II from falling off when forming the in-situ doped epitaxial layer, the thickness of the first mask layer after the thinning treatment cannot be too small. On the other hand, if the thickness of the first mask layer after the thinning treatment is too large, it is not effective to reduce the contact resistance of the surface of the in-situ doped epitaxial layer. In one embodiment, the thickness of the first mask layer after the thinning treatment may be in a range of approximately 2 nm-6 nm.

Figure 10:
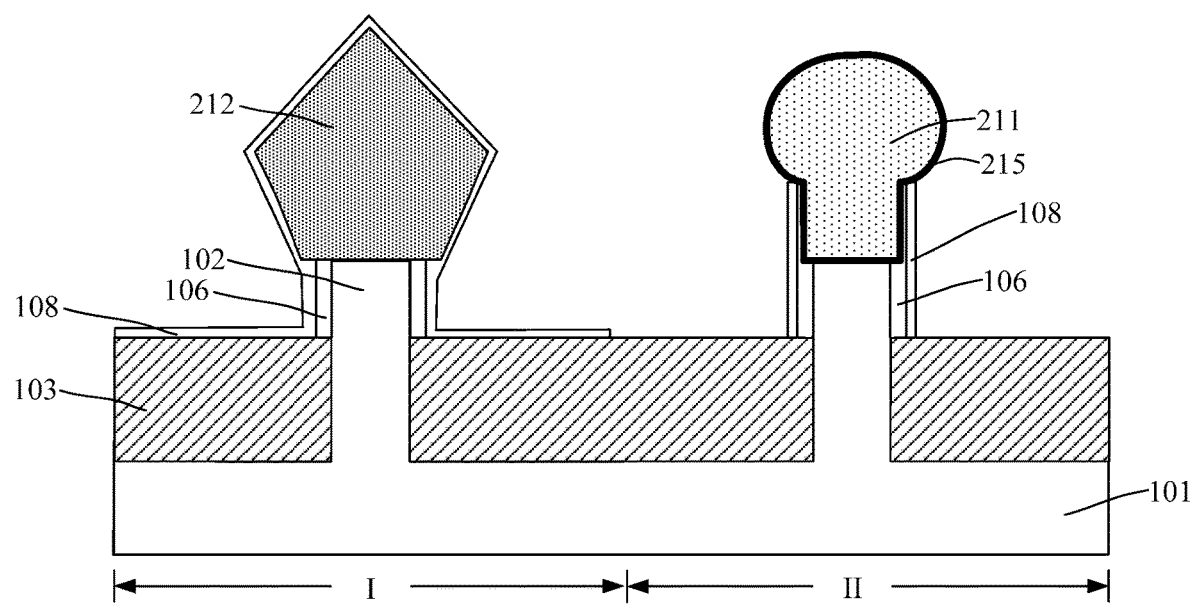

Returning to FIG. 13, after performing the thinning treatment, an in-situ doped epitaxial layer may be formed (S109). FIG. 10 illustrates a corresponding semiconductor structure.

Referring to FIG. 10, an in-situ doped epitaxial layer 211 may be formed to fill up the first trench 201 (shown in FIG. 9). The ions doped in the in-situ doped epitaxial layer 211 may be N-type ions.

Before forming the in-situ doped epitaxial layer 211, the fabrication method may also include performing a cleaning process on the first trench 201. The cleaning process may be configured to remove the impurities on the surface of the first trench 201, and the oxide layer formed on the surface of the fins 102.

In one embodiment, the top of the in-situ doped epitaxial layer 211 may be above the top of the fins 102 (shown in FIG. 4) before forming the first trench 201. The in-situ doped epitaxial layer 211 may be formed by a selective epitaxial process. The in-situ doped epitaxial layer 211 may be made of SiP, or SiCP, etc. Because the in-situ doped epitaxial layer 211 may be doped with N-type ions, the film growth rate of the selective epitaxial process may be fast when forming the in-situ doped epitaxial layer 211 by the selective epitaxial process. Therefore, the first mask layer may need to be above the top of the etched fins 102 in the NMOS region II. The first mask layer may be configured to limit the overgrowth of the in-situ doped epitaxial layer 211, and to confine the in-situ doped epitaxial layer 211 formed in the first trench 201 within a region surrounded by the first mask layer and the fins 102 in the NMOS region II, so as to avoid the width of the in-situ doped epitaxial layer 211 formed on the fins 102 in the NMOS region II to be too large.

Because the growth of the in-situ doped epitaxial layer 211 formed in the first trench 201 may be limited, correspondingly, the top surface area of the in-situ doped epitaxial layer 211 above the fins 102 (shown in FIG. 4) before forming the first trench 201 may be small. Therefore, in one embodiment, the thinning treatment may be performed on the first mask layer to increase the width of the first trench 201. As a result, the width of the in-situ doped epitaxial layer 211 formed in the first trench 201 may increase, thus the top surface area of the in-situ doped epitaxial layer 211 above the fins 102 (shown in FIG. 4) before forming the first trench 201 may be large. At the same time, the first mask layer may also limit the overgrowth of the in-situ doped epitaxial layer 211.

When forming the in-situ doped epitaxial layer 211 by the selective epitaxial process, the top surface area of the in-situ doped epitaxial layer 211 may be related to the width of the first trench 201. The larger the width of the first trench 201, the larger the top surface area of the in-situ doped epitaxial layer 211 can be.

In one embodiment, the top of the in-situ doped epitaxial layer 211 may be above the top of the fins 102 (shown in FIG. 4) before forming the first trench 201. Because of the characteristic of the selective epitaxial process, the top surface of the in-situ doped epitaxial layer 211 may be a smooth transition umbrella surface. In certain embodiments, when the distance between the top of the in-situ doped epitaxial layer 211 and the top of the fins 102 (shown in FIG. 4) before forming the first trench 201 as well as the top of the third mask layer 108 and the second mask layer 106 is large, the sidewall of the in-situ doped epitaxial layer 211 above the fins 102 (shown in FIG. 4) before forming the first trench 201 may include a vertex that protrudes away from the fins 102. After forming the in-situ doped epitaxial layer 211, an N-type doping process may be performed on the in-situ doped epitaxial layer 211 to increase the doping concentration of the formed N-type source-drain doped region, and to dope the fins 102 below the in-situ doped epitaxial layer 211.

To avoid process damages to the surface of the in-situ doped epitaxial layer 211 by the subsequent fabrication processes, the fabrication process may also include performing an oxidation treatment on the surface of the in-situ doped epitaxial layer 211 to form an oxidation protection layer 215 on the surface of the in-situ doped epitaxial layer 211. The oxidation treatment may include dry oxidation, wet oxidation, or water vapor oxidation, etc.

In FIGS. 5-10, the second trench may be formed first, and then the first trench may be formed. In certain embodiments, the first trench may be formed first, and then the second trench may be formed. The process of forming the first mask layer and the first trench may include forming a first mask layer on the top and sidewall of the fin portion in the NMOS region, where the first mask layer may also be formed on the top and sidewall of the fin portion in the PMOS region. The process may also include etching and removing the first mask layer formed on the top of the fin portion on both sides of the gate structure in the NMOS region to form a first trench. In addition, the process may include performing a thinning treatment on the first trench. Further, the process may include forming an in-situ doped epitaxial layer to fill up the first trench. The process of forming the second mask layer and the second trench may include using the first mask layer formed in the PMOS region as a second mask layer. The process may also include etching and removing the second mask layer formed on the top of the fin portion on both sides of the gate structure in the PMOS region to form a second trench. Further, the process may include forming a P-type source-drain doped region to fill up the second trench.

Before forming the first trench, a first patterned layer may be formed on the PMOS region. The first patterned layer may cover the first mask layer in the PMOS region. After performing the thinning treatment, the first patterned layer may be removed. Before forming the second trench, a second patterned layer may be formed on the NMOS region. The second patterned layer may cover the in-situ doped epitaxial layer. After forming the P-type source-drain doped region, the second patterned layer may be removed.

Returning to FIG. 13, after forming the in-situ doped epitaxial layer, the first mask layer may be removed (S110). FIG. 11 illustrates a corresponding semiconductor structure.

Referring to FIG. 11, in one embodiment, the third mask layer 108 (shown in FIG. 10) and the second mask layer 106 (shown in FIG. 10) may be etched and removed. A wet etching process may be performed to etch and remove the first mask layer. The etching liquid used in the wet etching process may be a phosphoric acid solution.

Etching and removing the first mask layer may provide a process base for subsequently forming an interlayer dielectric layer, thus the process window for subsequently forming the interlayer dielectric layer may be large.

Returning to FIG. 13, after removing the first mask layer, an interlayer dielectric layer may be formed (S111). FIG. 12 illustrates a corresponding semiconductor structure.

Referring to FIG. 12, an interlayer dielectric layer 402 may be formed to cover the gate structure 110 (shown in FIG. 3), the isolation layer 103 and the in-situ doped epitaxial layer 211. The interlayer dielectric layer 402 may also be formed on the P-type source-drain doped region 212.

In one embodiment, before forming the interlayer dielectric layer 402, an etching stop layer 401 may be optionally formed on the gate structure 110, the isolation layer 103, the in-situ doped epitaxial layer 211, and the P-type source-drain doped region 212. The etching stop layer 401 may be made of silicon nitride.

In one embodiment, the gate structure 110 may be a dummy gate structure. After forming the interlayer dielectric layer 402, the fabrication process may also include: etching and removing the gate structure 110; forming a first opening in the interlayer dielectric layer 402 in the PMOS region I; forming a second opening in the interlayer dielectric layer 402 in the NMOS region II; forming a first metal gate structure to fill up the first opening; and forming a second metal gate structure to fill up the second opening.

Accordingly, in the disclosed embodiments, because the width of the first mask layer formed on the fin portion in the NMOS region may be large when forming the first trench by the etching process, the mechanical strength of the first mask layer may be strong, preventing the first mask layer from falling off After forming the first trench, the thinning treatment may be performed on the sidewall of the first mask layer formed on the fins in the NMOS region. The thinning treatment may be configured to increase the width of the first trench, so as to increase the volume capacity of the first trench. Correspondingly, the volume of the in-situ doped epitaxial layer may increase, the resistance of the N-type source-drain doped region subsequently formed in the first trench may decrease, and the surface area of the N-type source-drain doped region may increase. As a result, the contact resistance between the surface of the N-type source-drain doped region and the metal silicide may decrease, thus improving the performance of the formed FinFET.

Before performing the thinning treatment, the thickness of the first mask layer may be in a range of approximately 6 nm-12 nm, thus the mechanical strength of the first mask layer may be strong, preventing the first mask layer from falling off. After performing the thinning treatment, the thickness of the first mask layer may be in a range of approximately 2 nm-6 nm, thus the width of the first trench may increase in a range of approximately 4 nm-10 nm. The remaining first mask layer may still have certain mechanical strength, preventing the first mask layer from falling off when forming the in-situ doped epitaxial layer.

In the FinFET consistent with the disclosed embodiments, the volume of the in-situ doped epitaxial layer may be large, thus the resistance of the in-situ doped epitaxial layer may be small. Because the surface area of the formed in-situ doped epitaxial layer may be large, the contact resistance between the surface of the correspondingly formed N-type source-drain doped region and the metal silicide may be small, thus improving the electrical performance of the formed FinFET.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A fin field effect transistor (FinFET), comprising:
a substrate including an NMOS (N-type metal-oxide-semiconductor) region and a PMOS (P-type metal-oxide-semiconductor) region;
a plurality of fins formed on the substrate;
an isolation layer formed between adjacent fins of the plurality of fins and on the substrate;
a gate structure across a length portion of the plurality of fins and covering a portion of each of a top surface and sidewalls of the plurality of fins;
an in-situ doped epitaxial layer formed on one of the plurality of fins on both sides of the gate structure in the NMOS region, wherein doping ions in the in-situ doped epitaxial layer are N-type ions; and
a P-type source-drain doped region formed another one of the plurality of fins on both sides of the gate structure in the PMOS (P-type metal-oxide-semiconductor) region;
wherein a bottom full width of the P-type source-drain doped region is greater than a maximum width of the another one of the plurality of fins in a direction perpendicular to an extension direction of the plurality of fins, and a bottom full width of the in-situ doped epitaxial layer is greater than a maximum width of the one of the plurality of fins in the direction perpendicular to the extension direction of the plurality of fins.

2. The FinFET according to claim 1, wherein:
the in-situ doped epitaxial layer is made of SiP (Silicon Phosphide) or SiCP (Silicon-Carbon Phosphide).

3. The FinFET according to claim 1, further including
an etching stop layer formed on the gate structure, the isolation layer, and the in-situ doped epitaxial layer.

4. The FinFET according to claim 3, further including
an interlayer dielectric layer formed on the etching stop layer.

5. The FinFET according to claim 1, wherein:
the in-situ doped epitaxial layer has a rectangular bottom section and a round top section.

6. The FinFET according to claim 5, wherein:
the bottom full width of the rectangular bottom section is greater than 0 nm and less than or equal to 12 nm wider than the maximum width of the one of the plurality of fins in the direction perpendicular to the extension direction of the plurality of fins.

7. The FinFET according to claim 1, wherein:
the P-type source-drain doped region has a pentagon top with a vertex protruding away from the plurality of fins.

8. The FinFET according to claim 7, wherein:
a bottom surface of the pentagon top is coplanar with the top surface of the plurality of fins, and
the bottom full width of the bottom surface is wider than the maximum width of the one of the plurality of fins in the direction perpendicular to the extension direction of the plurality of fins.

9. The FinFET according to claim 1, further including:
an oxidation protection layer formed on surfaces of the P-type source-drain doped region.

* * * * *